(12) United States Patent
Cheng et al.

(10) Patent No.: US 8,143,081 B2
(45) Date of Patent: Mar. 27, 2012

(54) METHOD FOR DICING A DICED OPTOELECTRONIC SEMICONDUCTOR WAFER

(75) Inventors: Chih-Ching Cheng, Taichung (TW); Chiung-Chi Tsai, Taichung (TW)

(73) Assignee: HUGA Optotech Inc., Taichung (TW)

( * ) Notice: Subject to any disclaimer, the term of this patent is extended or adjusted under 35 U.S.C. 154(b) by 968 days.

(21) Appl. No.: 11/706,822

(22) Filed: Feb. 13, 2007

(65) Prior Publication Data

US 2008/0194080 A1 Aug. 14, 2008

(51) Int. Cl.
*H01L 21/00* (2006.01)
(52) U.S. Cl. .................... 438/33; 438/68; 438/113
(58) Field of Classification Search .............. 438/33, 438/68, 113
See application file for complete search history.

(56) References Cited

U.S. PATENT DOCUMENTS

| | | | |
|---|---|---|---|
| 4,729,971 A * | 3/1988 | Coleman | 438/462 |
| 6,271,102 B1 * | 8/2001 | Brouillette et al. | 438/462 |
| 6,399,463 B1 * | 6/2002 | Glenn et al. | 438/463 |
| 6,995,032 B2 * | 2/2006 | Bruhns et al. | 438/33 |
| 7,572,657 B2 * | 8/2009 | Yakushiji | 438/33 |
| 7,611,966 B2 * | 11/2009 | Li et al. | 438/460 |
| 7,772,611 B2 * | 8/2010 | Kamikawa et al. | 257/103 |
| 2002/0031899 A1 * | 3/2002 | Manor | 438/460 |
| 2005/0130390 A1 * | 6/2005 | Andrews et al. | 438/458 |
| 2005/0263854 A1 * | 12/2005 | Shelton et al. | 257/615 |
| 2007/0045229 A1 * | 3/2007 | Keenan et al. | 216/65 |
| 2007/0105345 A1 * | 5/2007 | Kurosawa | 438/460 |
| 2009/0206359 A1 * | 8/2009 | Nabekura | 257/103 |

* cited by examiner

*Primary Examiner* — James Mitchell
(74) *Attorney, Agent, or Firm* — Jianq Chyun IP Office

(57) ABSTRACT

A method for dicing an optoelectronic semiconductor wafer has steps of preparing an optoelectronic semiconductor wafer, laser scribing, diamond saw dicing and forming optoelectronic semiconductor dies. A product for dicing an optoelectronic semiconductor wafer has a substrate and an epitaxial layer. The substrate has a first surface, a second surface and two rough surfaces. The rough surfaces are formed by laser scribing the wafer to define multiple guide grooves on the wafer and diamond saw grooving the wafer along the guide grooves. The epitaxial layer is formed epitaxially on the first surface of the substrate.

9 Claims, 7 Drawing Sheets

METHOD FOR DICING A DICED OPTOELECTRONIC SEMICONDUCTOR WAFER

BACKGROUND OF THE INVENTION

1. Field of Invention

The present invention relates to an optoelectronic semiconductor device, and more particularly to a method and product for dicing an optoelectronic semiconductor wafer that combines a laser scribing and a diamond saw dicing and reduces wear of diamond saws.

2. Description of the Related Art

Optoelectronic semiconductor devices such as blue LEDs are used widely in display, illumination and data storage technologies. Because red, green, and blue are the primary colors that are mixed to display the color of pixels on a computer monitor, high-brightness blue-light LEDs are more and more important in the application of color monitors. Because of short wavelength of blue light, blue LEDs are also used as light sources in data storage and access technology. In addition, white LEDs improved from blue LEDs are considered important in next generation illumination technology.

Wafers of blue and white LEDs generally comprise a sapphire substrate and an epitaxial layer formed epitaxially on the sapphire substrate. Wafers of blue and whites LEDs are separated typically into multiple dies by diamond saw dicing process or laser dicing process. With reference to FIG. 6, when a wafer is separated by diamond saw dicing process, the sapphire substrate of the wafer is mechanically scribed with a diamond saw to define multiple guide grooves (80) with a depth in several um on the sapphire substrate. Finally, the wafer is broken into multiple dies along the guide grooves (80) by means of a breaking machine. Because of the extreme hardness of the sapphire substrate, the diamond saw is usually worn off seriously after the diamond saw dicing process and this causes high operating and manufacturing costs. Additionally, because the conventional diamond saw dicing process is sharp pointed scribing and usually causes lateral and radial cracks at two sides of the guide grooves (80), the wafer often does not break completely along the guide grooves (80) and this causes chipping and cracking of the dies. So appearances of the dies may be bad and die yield is reduced.

With reference to FIG. 7, the conventional laser dicing process uses lasers to substitute for diamond saws to perform scribing. Because guide grooves (90) formed by the laser dicing process have a high aspect ratio, dies after breaking have better appearances. Manufacturing costs of the dies are also reduced because of no wear of diamond saw. However, the conventional laser dicing process usually causes black layers formed in the guide grooves (90). So the dies have black areas on the surfaces of the dies and this affects the light extraction efficiency of the dies.

Because the dicing process is a back-end manufacturing process of semiconductor devices, expensive costs of the front-end manufacturing processes are wasted if dicing process is not performed well and causes discarding of the dies. Consequently, dicing process is very important for manufacturing optoelectronic semiconductor devices such as blue LEDs.

To overcome the shortcomings, the present invention provides a method and product for dicing an optoelectronic semiconductor wafer to mitigate or obviate the aforementioned problems.

SUMMARY OF THE INVENTION

The primary objective of the present invention is to provide a method and product for dicing an optoelectronic semiconductor wafer that combines a laser scribing and a diamond saw grooving and reduces wear of the diamond saw.

A method for dicing an optoelectronic semiconductor wafer in accordance with the present invention comprises steps of preparing an optoelectronic semiconductor wafer, laser scribing, diamond saw grooving and forming optoelectronic semiconductor dies.

In the preparing an optoelectronic semiconductor wafer step, the wafer comprises a substrate having a first surface and a second surface and an epitaxial layer formed epitaxially on the first surface of the substrate.

In the laser scribing step, the laser scribing is performed by scribing the substrate with a laser to define multiple guide grooves in the substrate.

In the diamond saw grooving step, the diamond grooving is performed by grooving the substrate along the guide grooves with a diamond saw.

In the forming optoelectronic semiconductor dies step, the dies are formed by breaking the wafer along the guide grooves.

A product for dicing an optoelectronic semiconductor wafer in accordance with the present invention comprises a substrate and an epitaxial layer. The substrate has a first surface, a second surface and two rough surfaces. The rough surfaces are formed by laser scribing the wafer to define multiple guide grooves in the wafer and diamond saw grooving the wafer along the guide grooves. The epitaxial layer is formed epitaxially on the first surface of the substrate.

Other objectives, advantages and novel features of the invention will become more apparent from the following detailed description when taken in conjunction with the accompanying drawings.

DETAILED DESCRIPTION OF THE INVENTION

Figure 1:
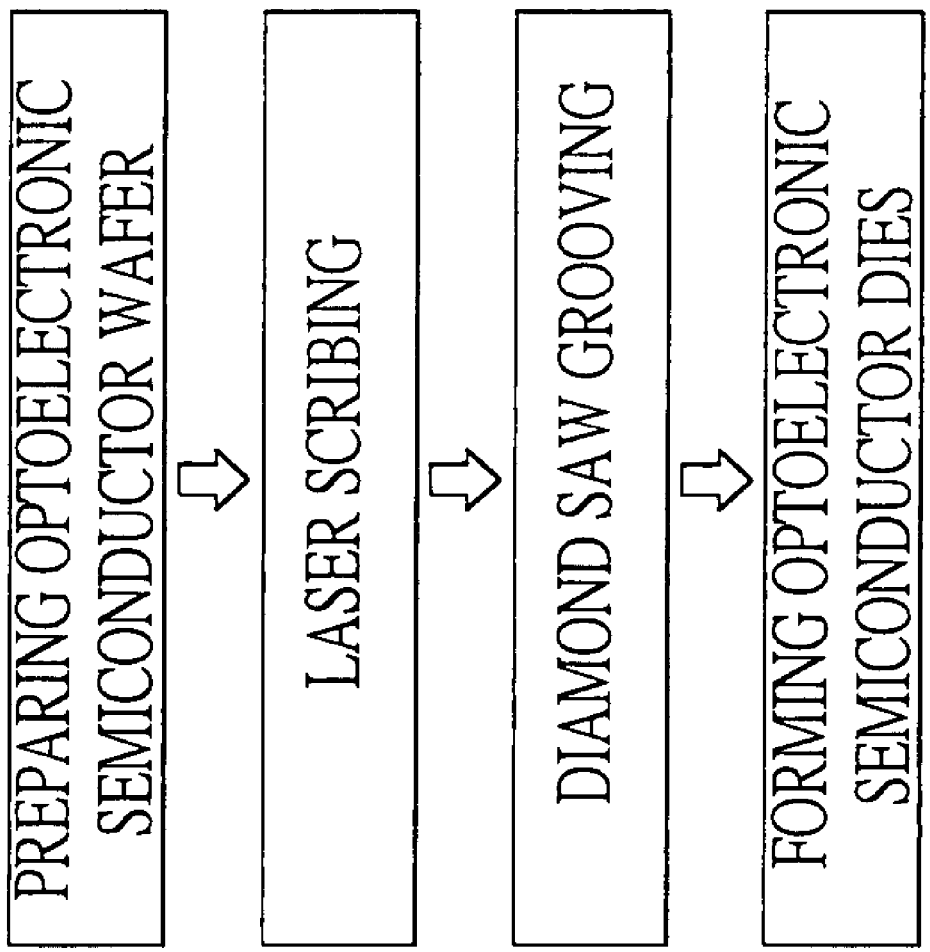
FIG. 1 is a block diagram of a method for dicing an optoelectronic semiconductor wafer in accordance with the present invention.

With reference to FIG. 1, a method for dicing an optoelectronic semiconductor wafer in accordance with the present invention comprises steps of preparing an optoelectronic semiconductor wafer, laser scribing, diamond saw grooving and forming optoelectronic semiconductor dies.

Figure 2:
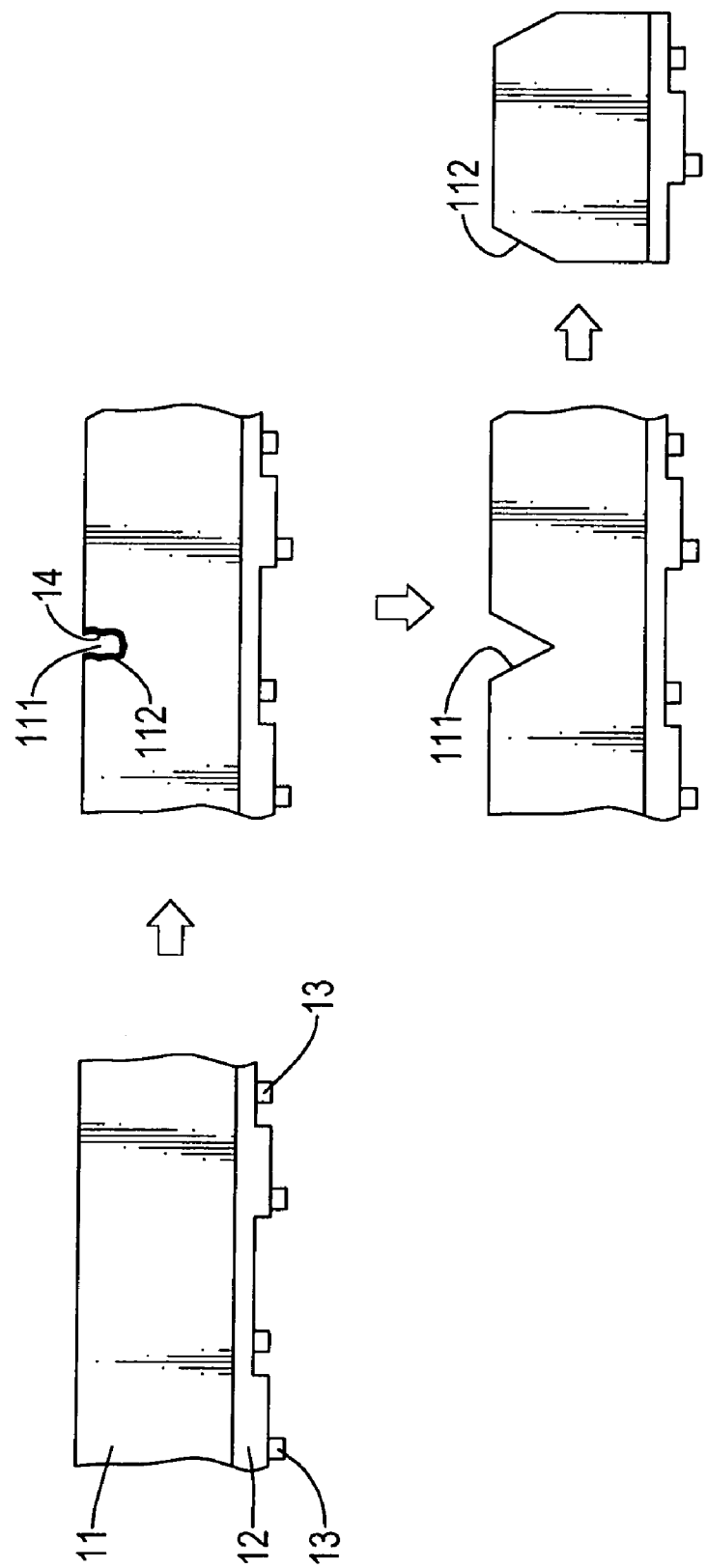
FIG. 2 is operational side views of a first embodiment of the method in FIG. 1.
Figure 3:
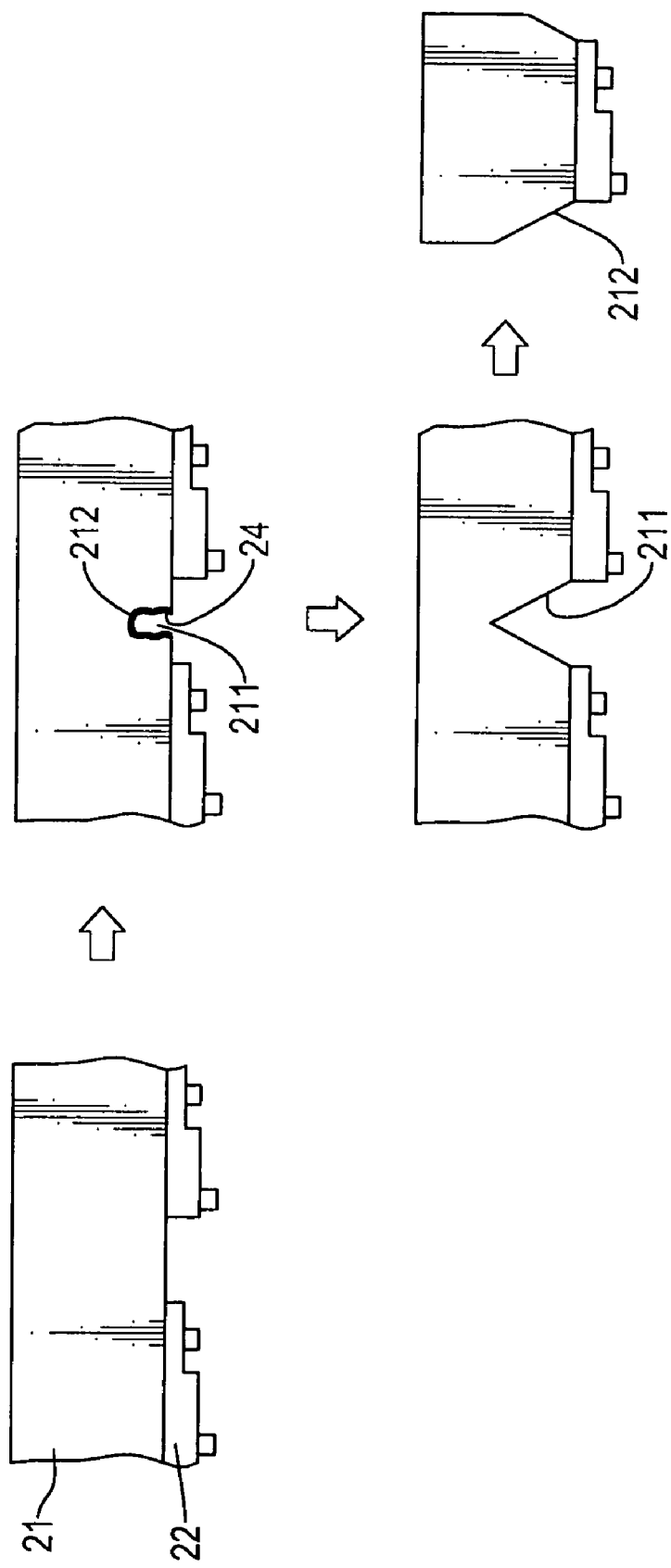
FIG. 3 is operational side views of a second embodiment of the method in FIG. 1.
Figure 4:
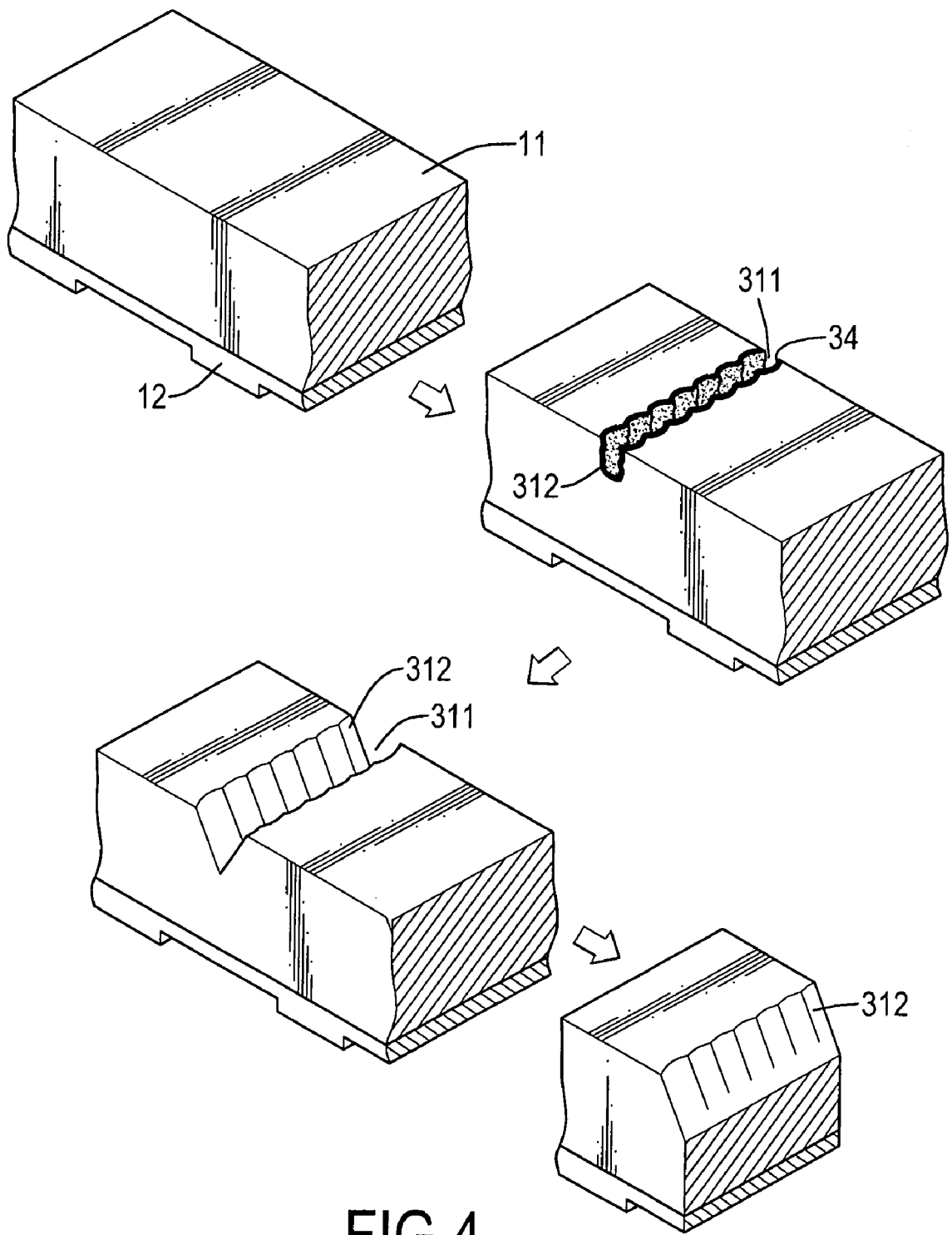
FIG. 4 is operational perspective views of the first embodiment of the method in FIG. 2 with using a pulsed laser.

With further reference to FIGS. 2, 3 and 4, in the preparing an optoelectronic semiconductor wafer step, the wafer comprises a substrate (11, 21), an epitaxial layer (12, 22) and multiple electrodes (13). The substrate (11,21) has a first surface and a second surface. The epitaxial layer (12, 22) is formed epitaxially on the first surface of the substrate (11, 21). The epitaxial layer (12, 22) may be made of III-V group materials, II-VI group materials, or IV group materials. The III-V group materials may be GaN, GaS, GaP, InP, InGaAlN, InGaAlP, InGaAlAs and GaAlPAs. The II-VI group materials may be ZnO, ZnSe, ZnS, or ZnTe. The IV group materials may be Si or Ge. The electrodes (13) are formed on the epitaxial layer (12, 22).

In the laser scribing step, the substrate (11, 21) is scribed with a laser to define multiple guide grooves (111, 211, 311) in the substrate (11, 21) and a black layer (14, 24, 34) is formed in each guide groove (111, 211, 311) and two rough surface are formed along the guide groove (111, 211, 311) under the black layers (14, 24, 34). In a first embodiment of the method as shown in FIG. 2, the guide grooves (111) are defined in the second surface of the substrate (11). In a second embodiment of the method as shown in FIG. 3, the epitaxial layer (22) upon an area of the first surface of the substrate (21) is removed and then the guide grooves (211) are defined in the area of the first surface of the substrate with a laser. In the first embodiment of the method as shown in FIG. 4, the guide grooves (311) in the second surface of the substrate (11) are wavy when using a pulsed laser.

In the diamond saw grooving step, the substrate (11, 21) is grooved along the guide grooves (111, 211, 311) with a diamond saw to scrape the black layer (14, 24, 34) in each guide groove (111, 211, 311) off, expose the rough surfaces (112, 212, 312) in the guide grooves (111, 211, 311) and increase the depth of each guide groove (111, 211, 311). Because the black layer (14, 24, 34) in each guide groove (111, 211, 311) is fragile and can be scraped off easily, the diamond saw is not worn seriously. In addition, when the diamond saw grooves the substrate (11, 21) along the guide grooves (111, 211, 311), the diamond saw engages the substrate (11, 21) with a larger contact area and causes less cracks. So the wafer needs not to keep a large cutting street for dicing and more dies can be separated from the wafer.

In the forming optoelectronic semiconductor dies step, the wafer is broken along the guide grooves (111, 211, 311) to form multiple optoelectronic semiconductor dies and each die has two rough surfaces (112, 212, 312). The rough surfaces (112, 212, 312) are inclined and increase light output effect of the dies. Because the black layer (14, 24, 34) in each guide groove (111, 211, 311) is scraped off by the diamond saw, the dies separated from the wafer have no black areas on the surfaces of the dies and have higher light extraction efficiency. In addition, because less cracks are formed in the guide grooves (111, 211, 311), the wafer can be broken completely along the guide grooves (111, 211, 311) to prevent the dies from chipping or cracking and improve die yield. In the first embodiment as shown in FIG. 2, the rough surfaces (112) are formed near the second surface of the substrate (11). In the second embodiment as shown in FIG. 3, the rough surfaces (212) are formed near the first surface of the substrate (21). In the first embodiment as shown in FIG. 4, the rough surfaces (312) are wavy with a pulsed laser scribing. The method can be used in different optoelectronic semiconductor devices such as LEDs, laser diodes, photodetectors and solar cells.

A product for dicing an optoelectronic semiconductor wafer in accordance with the present invention as shown in FIGS. 2, 3 and 4 comprises a substrate and an epitaxial layer. The substrate has a first surface, a second surface and two rough surfaces (112, 212, 312). The rough surfaces (112, 212, 312) are formed by laser scribing the wafer to define multiple guide grooves on the wafer and diamond saw grooving the wafer along the guide grooves. The rough surfaces (112, 212, 312) may be inclined by means of diamond saw grooving or wavy by means of laser scribing and may be formed near the first surface or the second surface of the substrate. The epitaxial layer is formed epitaxially on the first surface of the substrate. The epitaxial layer may be made of III-V group materials, II-VI group materials, or IV group materials. The III-V group materials may be GaN, GaS, GaP, InP, InGaAlN, InGaAlP, InGaAlAs and GaAlPAs. The II-VI group materials may be ZnO, ZnSe, ZnS, or ZnTe. The IV group materials may be Si or Ge.

Figure 5:
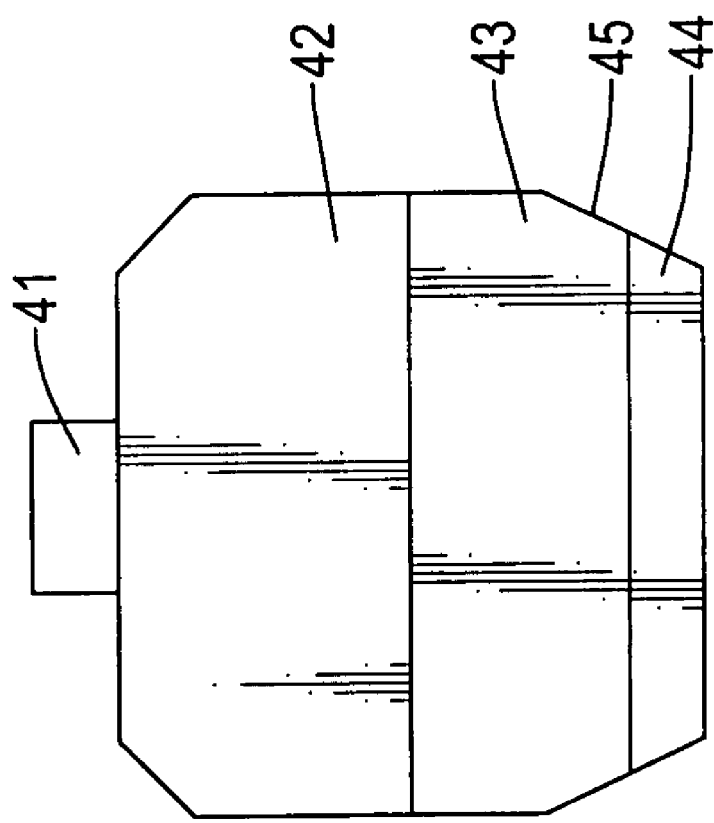
FIG. 5 is a side view of an embodiment of a product for dicing an optoelectronic semiconductor wafer in accordance with the present invention.
Figure 6:
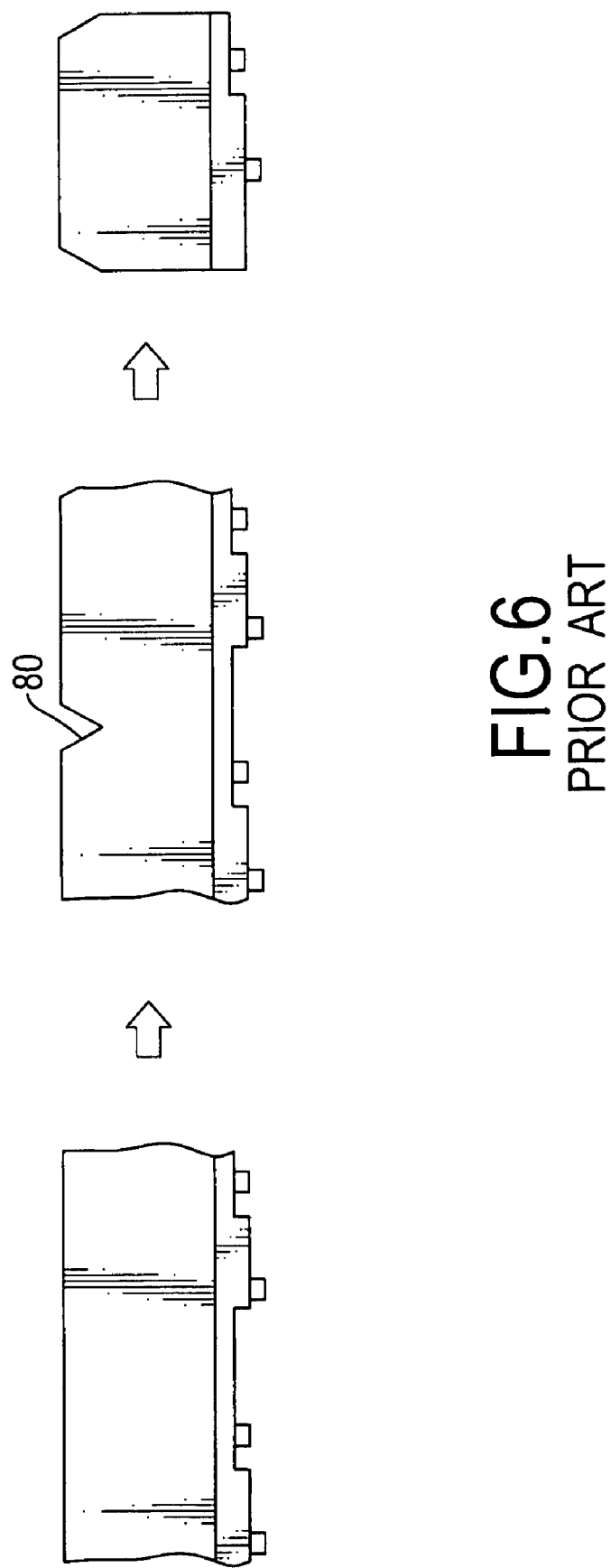
FIG. 6 is operational views of a conventional diamond saw dicing process in accordance with the prior art.
Figure 7:
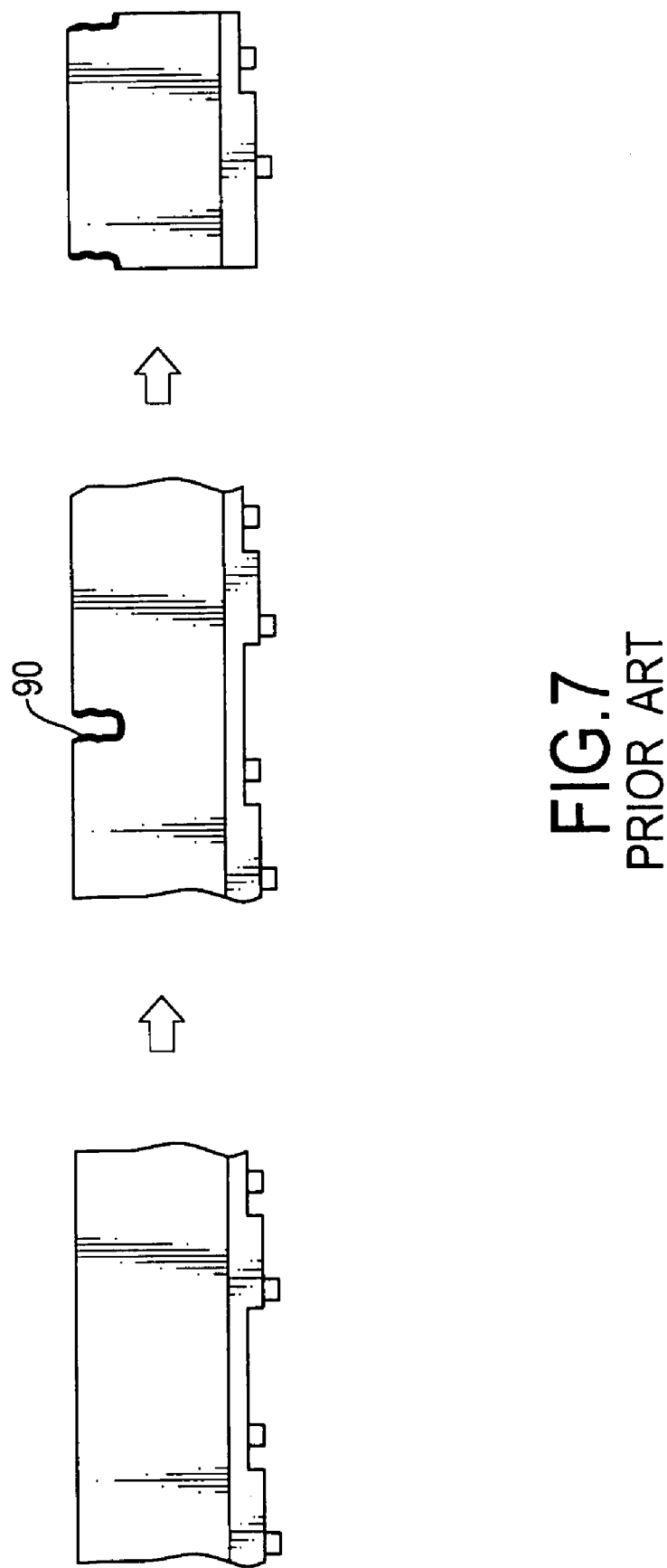
FIG. 7 is operational views of a conventional laser dicing process in accordance with the prior art.

With reference to FIG. 5, an embodiment of the product comprises an n-type GaAs substrate (43), a GaAs epitaxial layer (42), a p-type electrode (41) and an n-type electrode (44). The n-type GaAs substrate (43) has a first surface, a second surface and two inclined rough surfaces (45). The inclined rough surfaces (45) are formed near the second surface of the GaAs substrate (43). The GaAs epitaxial layer (42) is formed epitaxially on the first surface of the substrate (43). The p-type electrode (41) is formed on the GaAs epitaxial layer (42). The n-type electrode (44) is formed on the second surface of the substrate (43).

Even though numerous characteristics and advantages of the present invention have been set forth in the foregoing description, together with details of the structure and function of the invention, the disclosure is illustrative only. Changes may be made in detail, especially in matters of shape, size and arrangement of parts within the principles of the invention to the full extent indicated by the broad general meaning of the terms in which the appended claims are expressed.

What is claimed is:

1. A method for dicing an optoelectronic semiconductor wafer comprising steps of
   preparing an optoelectronic semiconductor wafer, wherein the wafer comprises
      a substrate having a first surface and a second surface;
      an epitaxial layer being formed epitaxially on the first surface of the substrate;
   scribing the substrate with a laser to define multiple guide grooves in the substrate and to form a black layer in each guide groove with two rough surfaces along the guide groove under the black layer;
   grooving the substrate along the guide grooves with a diamond saw to scrape off the black layer in each guide groove to expose the rough surfaces; and
   forming optoelectronic semiconductor dies by breaking the wafer along the guide grooves.

2. The method as claimed in claim 1, wherein the guide grooves are defined in the second surface of the substrate.

3. The method as claimed in claim 2, wherein the epitaxial layer is made of III-V group materials.

4. The method as claimed in claim 2, wherein the epitaxial layer is made of II-VI group materials.

5. The method as claimed in claim 2, wherein the epitaxial layer is made of IV group materials.

6. The method as claimed in claim 1, wherein the method further comprises a step of removing the epitaxial layer upon an area of the first surface of the substrate before the step of scribing the substrate with a laser to define multiple guide grooves in the substrate.

7. The method as claimed in claim 6, wherein the epitaxial layer is made of III-V group materials.

8. The method as claimed in claim 6, wherein the epitaxial layer is made of II-VI group materials.

9. The method as claimed in claim 6, wherein the epitaxial layer is made of IV group materials.

* * * * *